United States Patent
Asada

(10) Patent No.: US 8,120,329 B2
(45) Date of Patent: Feb. 21, 2012

(54) APPARATUS FOR CONTROLLING POWER GENERATED BY ON-VEHICLE GENERATOR ON THE BASIS OF INTERNAL STATUS OF ON-VEHICLE BATTERY

(75) Inventor: Tadatoshi Asada, Anjo (JP)

(73) Assignee: Denso Corporation, Kariya (JP)

( * ) Notice: Subject to any disclaimer, the term of this patent is extended or adjusted under 35 U.S.C. 154(b) by 602 days.

(21) Appl. No.: 12/222,278

(22) Filed: Aug. 6, 2008

(65) Prior Publication Data
US 2009/0039836 A1 Feb. 12, 2009

(30) Foreign Application Priority Data
Aug. 10, 2007 (JP) .................................. 2007-209359

(51) Int. Cl.
*H02J 7/04* (2006.01)
*H02J 7/16* (2006.01)
(52) U.S. Cl. ........................................ 320/152; 320/150
(58) Field of Classification Search ........... 320/150–152
See application file for complete search history.

(56) References Cited

U.S. PATENT DOCUMENTS

| | | | | |
|---|---|---|---|---|
| 5,666,040 A * | 9/1997 | Bourbeau | ..................... | 320/118 |
| 5,760,587 A * | 6/1998 | Harvey | ......................... | 324/434 |
| 6,060,859 A * | 5/2000 | Jonokuchi | ..................... | 318/801 |
| 7,145,322 B2 * | 12/2006 | Solveson et al. | ............. | 324/127 |
| 7,253,602 B2 * | 8/2007 | Shvach et al. | ................. | 324/127 |
| 7,319,304 B2 * | 1/2008 | Veloo et al. | ................... | 320/134 |
| 2005/0057865 A1 * | 3/2005 | Veloo et al. | ..................... | 361/56 |

FOREIGN PATENT DOCUMENTS

| | | |
|---|---|---|
| JP | A-2001-272422 | 10/2001 |
| JP | A-2005-188931 | 7/2005 |
| JP | A-2006-10601 | 1/2006 |
| JP | A-2006-32184 | 2/2006 |

OTHER PUBLICATIONS

Japanese Notification of Reasons for Rejection issued on Jun. 30, 2009 in corresponding Japanese Patent Application No. 2007-209359 (with English-language translation).

* cited by examiner

*Primary Examiner* — Ramy Ramadan
(74) *Attorney, Agent, or Firm* — Oliff & Berridge, PLC

(57) ABSTRACT

An apparatus for controlling power generation of a generator mounted on a vehicle, the generator charging a on-vehicle battery, comprising a detecting device that detects information indicating the internal status of the battery that includes temperature of the battery, a power supply circuit that supplies power to the detecting device, a calculator for calculating the internal status of the battery using the information detected by the detecting device, a circuit board on which the calculator, the power supply circuit, and the detecting circuit are mounted and a controller that controls the power generation of the generator based on the internal status of the battery. The temperature sensing element is arranged on a bus bar that is electrically connected to the negative terminal of the battery, and the bus bar and the temperature sensing element are coupled thermally to each other.

11 Claims, 3 Drawing Sheets

APPARATUS FOR CONTROLLING POWER GENERATED BY ON-VEHICLE GENERATOR ON THE BASIS OF INTERNAL STATUS OF ON-VEHICLE BATTERY

CROSS-REFERENCE TO RELATED APPLICATION

This application is related to Japanese Patent Application NO. 2007-209359 filed on Aug. 10, 2007, the contents of which are hereby incorporated by reference.

BACKGROUND OF THE INVENTION

1. Field of the Invention

The present invention relates to a power generation control apparatus for vehicles and in particular, to an apparatus for controlling power generated by an on-vehicle generator based on the internal status of the battery mounted on vehicles such as cars and trucks.

2. Description of the Related Art

In recent years, a vehicle is usually provided with an apparatus for controlling power generated by an alternator (i.e., a vehicular AC generator). Some of these control apparatuses need information indicative of how the battery degrades. One of such control apparatuses is disclosed by, for example, Japanese Patent Laid-Open Publication Number JP2006-10601. The control apparatus disclosed by this patent publication comprises a temperature sensor sensing the temperature of an on-vehicle battery, a temperature detecting circuit receiving a signal indicative of the sensed temperature, a current sensor sensing charging/discharging current of the on-vehicle battery, and a current detecting circuit receiving a signal indicative of the sensed current. This control apparatus also comprises a microprocessor which receives signals coming from those detecting circuits and processes the received signals to estimate the degradation degree of an on-vehicle battery.

By the way, mounting the temperature sensor can be achieved by various types of structures. One example is disclosed by Japanese Patent Laid-Open Publication Number JP2001-272422, in which the temperature sensor has a thermal element thermally coupled to a bus bar of an on-vehicle battery. Another example is disclosed by Japanese Patent Laid-Open Publication Number JP2006-32184, in which the temperature sensor is arranged close to an on-vehicle battery pack so as to have an indirect connection with the battery pack.

In these structures disclosed by the above publication Nos. JP2001-272422 and JP2006-32184, the signals from a detecting circuit is connected to a circuit board of an ECU (Electronic Control Unit) or the like with a signal wiring.

In general, equipment having microprocessors includes necessary circuits such as a power supply circuit to supply power to various circuit blocks, a communication circuit to communicate with external devices and other peripheral circuits. Those circuits are mounted together on the same circuit board. However the sensors detecting temperature and current in the above-described related art are arranged apart from the circuit board, so that sensors and the board are required to be connected with signal wiring. Accordingly, the above-described related art has a drawback, as described below.

In vehicles, inductive noise occurs while the ignition system, which is in operation, causes electrical noise which may partly propagate to signal wirings which connect various sensors and electrical circuit boards. Accordingly, if such a case occurs, signals from the sensors cannot be recognized properly by a controller. Moreover, when the vehicle is running, there is a concern that the signal wirings may be cut or disconnected due to vibration stress coming from the road or the on-vehicle engine.

There are additional problems concerning the above wiring connection manner. First, since the temperature sensor is arranged apart from the circuit board, mounting the sensor to the vehicle needs much work, thus raising assembling cost as a whole. Another problem is that the number of signal wirings increases, whereby wiring errors are more likely to occur.

SUMMARY OF THE INVENTION

An object of the present invention is to provide an apparatus that is able to prevent various difficulties, such as a malfunction due to noise and improper wiring, caused in association with the fact that sensors and circuits boards are connected using signal wirings, thus improving the reliability of the apparatus.

To achieve above-described object, an apparatus for controlling power generation of a generator mounted on a vehicle, the generator charging an on-vehicle battery is provided. The apparatus comprises a detecting device that detects information indicating an internal status of the battery that includes temperature of the battery, a power supply circuit that supplies power to the detecting device, a calculator (i.e., an arithmetic circuit) for calculating the internal status of the battery using the information detected by the detecting device, a circuit board on which the calculator, the power supply circuit, and the detecting circuit are mounted and a controller that controls the power generation of the generator based on the internal status of the battery. The temperature sensing element is arranged on a bus bar that is electrically connected to a negative terminal of the battery, and the bus bar and the temperature sensing element are coupled thermally to each other. Therefore, since no external wiring is required to connect the board and the sensor (i.e., the temperature sensing element), unwanted noise propagating through the wiring can be removed so that malfunction of the apparatus caused by the noise disappears and also, decreasing reliability caused by the vibration stress in the vehicle can be prevented.

Furthermore, the connection between the circuit board and the temperature sensing element can be completed in the same manufacturing step as connecting the arithmetic circuitry and the power supply circuit. Thus, the assembly cost of the vehicle can be reduced along with the work load. Also, since the wiring is in the circuit board, the vehicle's reliability can be improved by avoiding improper wiring between devices.

In addition, the bus bar and the circuit board are arranged in at least two planar layers each, the temperature sensing element being mounted on the circuit board is preferably arranged in a layer facing with the bus bar. Since the sensing element is positioned in a plane adjacent to the bus bar, the element detects the temperature of the bus bar easily (can improve the characteristics of the thermal coupling between the bus bar and the element). As the bus bar is connected to the negative terminal of the battery, connecting to an internal terminal of the battery with very low resistance, the thermal resistance can be lowered. Accordingly, it is possible to improve the detecting thermal characteristics between the internal portion of the battery and the sensing element.

Specifically, the bus bar described above also has a function of a shunt resistor to detect current of the battery. The temperature sensing element is preferably arranged close to two poles which detect voltage difference by the shunt resistor. The shunt resistor has a good electrical conductivity, and necessarily has a good thermal conductivity. Hence, the characteristics of the thermal coupling between the bus bar and the temperature sensing element can be enhanced by placing the element close to the poles.

Also, one pole in the two poles as described above is connected to the ground terminal of the circuit board, and the temperature sensing element is preferably arranged close to the other pole of the two poles. Since the sensing element is arranged close to the other pole not the pole where current to be consumed in the circuit board flows, it makes it possible to reduce the influence of the current. Hence, the characteristic of the thermal coupling is enhanced.

The circuit board as described above has a large area of the ground plane as a reference potential plane. The temperature sensing element is preferably arranged at a point which is apart from the ground plane. The large area of the ground plane makes it possible to reduce heat occurring at the circuit board caused by the current consumption and arranging the sensing element apart from the ground plane enhance the characteristic of the thermal coupling.

In addition, the circuit board as describe above has a large sensing area that has the same electrical potential as the pole where the voltage is detected. The sensing element is preferably arranged on the plane of the sensing area. Since the sensing element is arranged on the relatively large sensing area that has the same electrical potential as the pole, it is also possible to enhance the characteristic of the thermal coupling.

The device for detecting the internal status of the battery (herein after called "battery status detecting device") includes a serial communication circuit which sends a battery status parameter based on the battery status or a control parameter of the vehicle generator calculated based on the battery status. The serial communication circuit is preferably arranged on the ground plane. Therefore, thermal influence caused by the driving current of the communication circuit while the circuit is in operation can be reduced, and then the characteristic of the thermal coupling is enhanced. Further, noise from the communication circuit can be prevented in such a way.

DETAILED DESCRIPTION OF THE PREFERRED EMBODIMENTS

Figure 1:
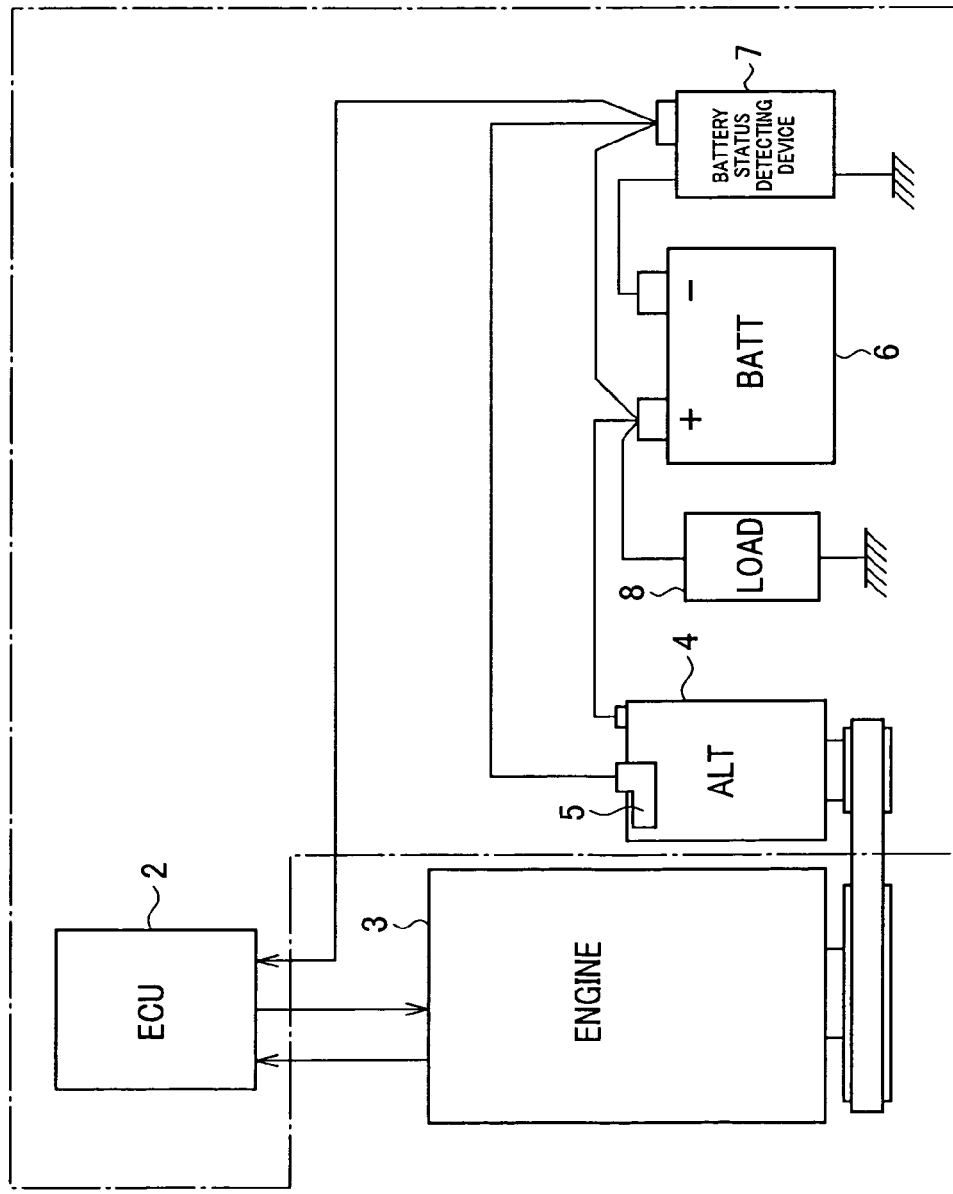
FIG. 1 is a block diagram showing the configuration of a power generation control apparatus according to an embodiment of the present invention.

An exemplary embodiment of a power generation control apparatus of the present invention is below described with reference to the attached drawings. FIG. 1 illustrates a configuration of a power generation control apparatus 1 according to an embodiment. As shown in FIG. 1, the power generation control apparatus 1 includes an ECU 2 (Electronic Control Unit 2), an engine 3, a vehicle generator (ALT) 4, a battery (BATT) 6, and a battery status detecting device 7.

The ECU 2 is an electronic control unit that controls an output of the engine 3 as an external controller. The vehicle generator 4 is rotated by the engine via a belt, and generates power. The power is provided to the battery 6 as a charging power and to various electrical loads (LOAD) 8. The generator (ALT) 4 includes a generation controller 5 that controls the output of the generator by adjusting the exciting current. The battery status detecting device 7 is arranged close to the battery 6 to detect the internal status of the battery 6 (e.g. detecting charge/discharge current or detecting temperature of the battery).

Figure 2:
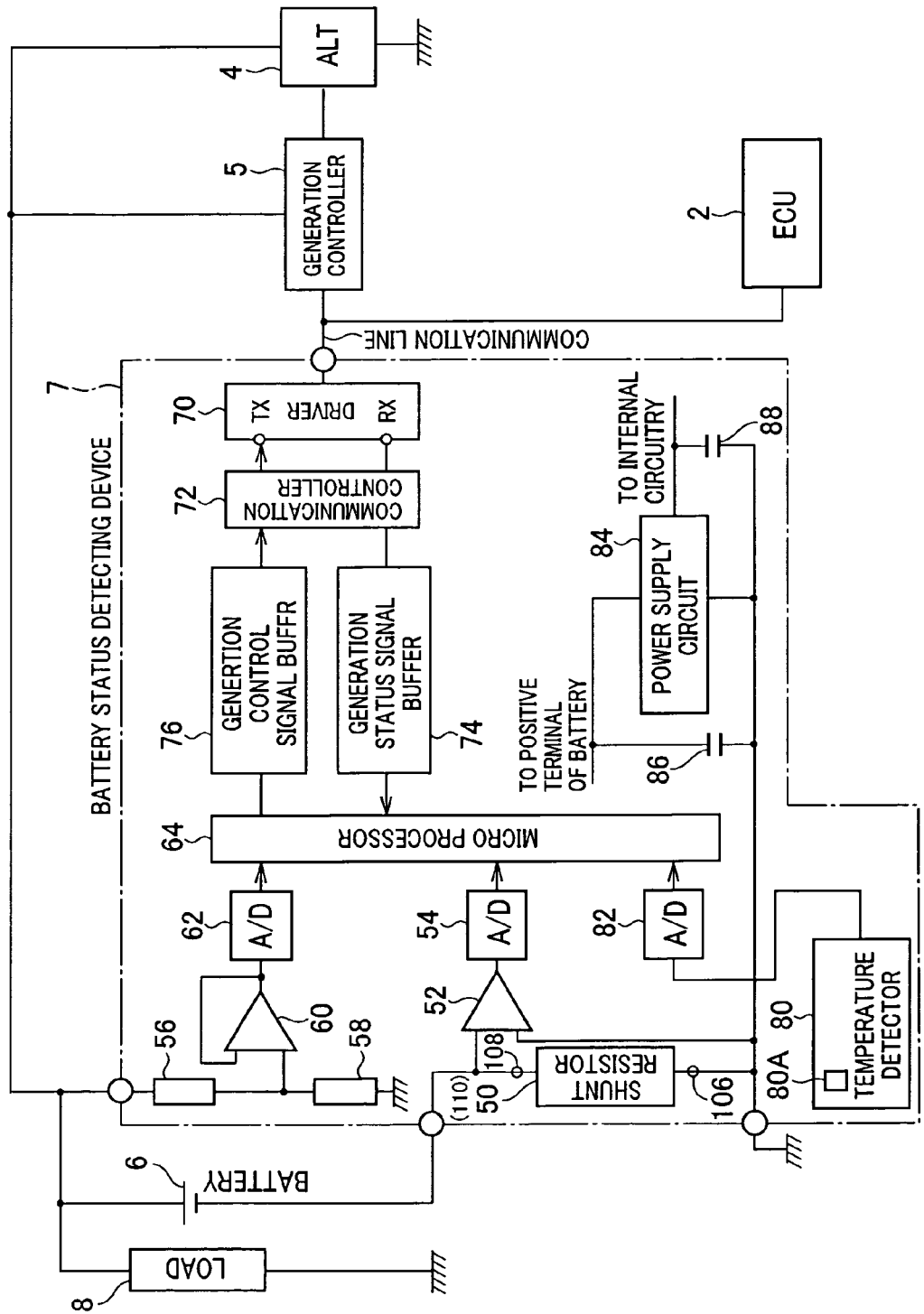
FIG. 2 is a block diagram showing a detailed configuration of a battery status detecting device according to an embodiment of the present invention.

FIG. 2 is a block diagram of a detail configuration of the detecting device 7 that illustrates the major circuitry of the device (a configuration showing a protective enclosure for the major circuitry is not shown). As shown in FIG. 2, the battery status detecting device 7 includes a shunt resistor 50, amplifiers 52, 60, analog-digital converters (A/D) 54, 62, 82, resistors 56, 58, a microprocessor 64, a driver 70, a communication controller 72, a generation status signal buffer 74, a generation control signal buffer 76, a temperature detector 80 with a temperature detecting element 80A, a power supply circuit 84 and capacitors 86, 88.

The shunt resistor 50 is a resistor for detecting the charge and discharge current of the battery 6. One terminal of the resistor is connected to the negative terminal of the battery 6 and the other terminal of the resistor is connected to the ground. The amplifier 52 can be such as a differential amplifier, which amplifies a voltage between both terminals of the shunt resistor 50. The amplified voltage is converted to digital data by the A/D converter 54. Then, the digital data is transferred to the microprocessor 64.

The resistors 56, 58 form a voltage divider circuit for detecting a terminal voltage of the battery 6 (i.e., battery voltage). One end terminal of the voltage divider is connected to the positive terminal of the battery 6 and the other terminal is connected to the ground. The amplifier 60 (e.g. operational amplifier) works as a buffer that is connected to the output side of the voltage divider consisting of resistors 56, 58. The A/D converter 62 converts the output voltage of the amplifier 60 (equal to the divided voltage at a point between resistors 56 and 58) into digital data that the microprocessor 64 receives.

The temperature detector 80 detects the temperature of the battery 6 such that the temperature detecting element 80A senses the temperature of the battery 6 and outputs corresponding voltage. This voltage is then converted to digital data by the A/D converter 82 and the microprocessor receives the digital data. Next, the data from the A/D converter is processed by the microprocessor 64 and the processor 64 performs a calculation of the battery status (e.g. charging status of the battery). The power supply circuit 84 supplies necessary power to the microprocessor 64 and the other circuitry. The driver 70 and the communication controller 72 include a function for sending/receiving data with the generation controller 5 via a communication line. When the driver 70 receives a digitally-modulated signal (generation status sending signal) from the generation controller 5 via the communication line, the communication controller demodulates the signal, and the signal (i.e., generation status signal) is stored to the generation status buffer 74. Meanwhile, when the generation control signal from the microprocessor 64 is stored to the generation control buffer, the communication controller 72 converts the generation control signal into a predetermined digital format and modulates the signal. Then the driver 70 sends the modulated signal (i.e., digital modulated signal) to the generation controller 5 via the communication line.

The above-described microprocessor 64 corresponds to the arithmetic circuitry, the temperature detector 80 corresponds to the detecting circuit and the communication controller 72 corresponds to the communication circuit.

Figure 3:
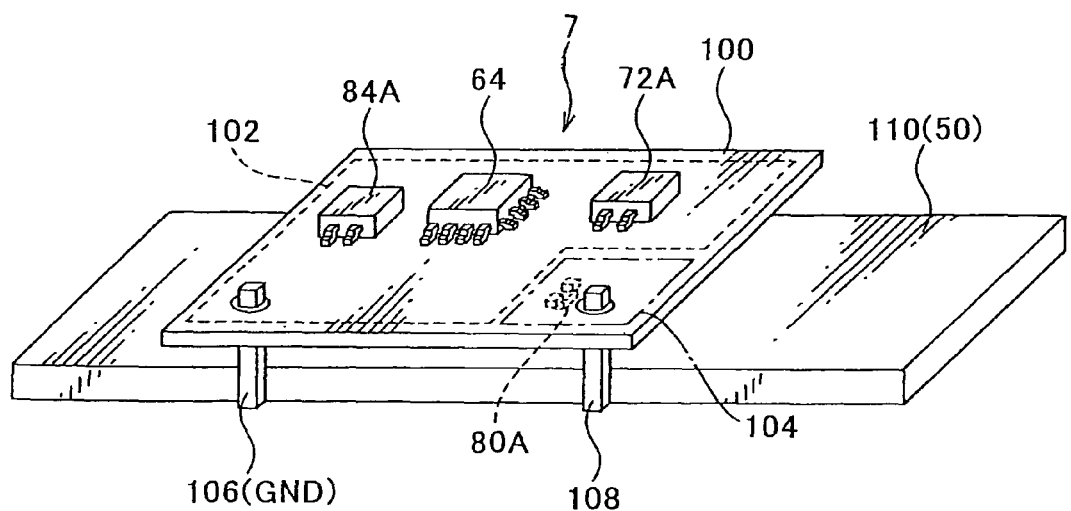
FIG. 3 is a perspective view showing an internal configuration of a battery status detecting device according to the embodiment.
Figure 4:
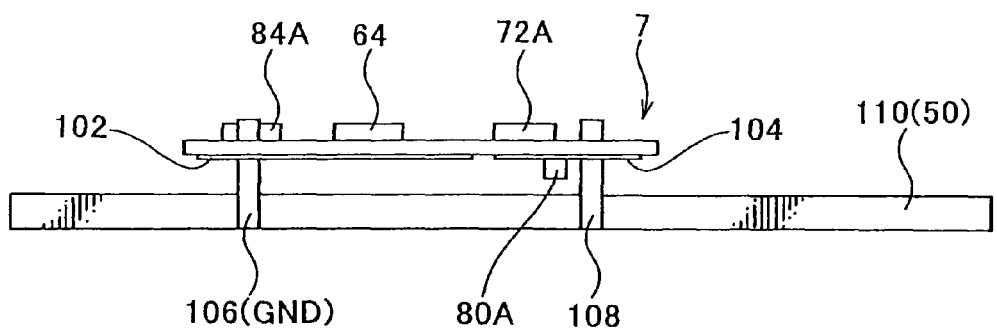
FIG. 4 is a side view showing an internal configuration of a battery status detecting device according to an embodiment.

FIG. 3 is a perspective view of the internal configuration of the battery status detecting device 7. FIG. 4 is a side view of the internal configuration of the battery status detecting device 7. As shown in FIGS. 3 and 4, the battery status detecting device 7 includes a circuit board 100 on which the microprocessor 64, communication IC 72A and power supply IC 84A are mounted. The communication IC 72A includes the communication controller 72 and the driver 70. The power supply IC 84A includes a power supply circuit 84. It is noted although the other components of the battery status detecting device 7 (e.g. temperature detector 80) as shown in FIG. 2 are also mounted on the circuit board 100, those components are not shown in FIGS. 3 and 4.

The circuit board 100 is arranged to be faced with a bus bar 110 that is connected to the negative terminal of the battery 6. Specifically, the circuit board and the bus bar 110 are arranged in at least two planar layers each, the temperature sensing element 80A is mounted at an under surface of the circuit board 100 that is confronted with the bus bar.

In addition, the bus bar 110 works as the shunt resistor 50. In order to detect the voltage difference of the shunt resistor, two poles 106 and 108 are arranged at the bus bar, and the distance between two poles have predetermined length. The pole 106 is connected to the ground terminal (GND), and the temperature detecting element 80A is located close to the other pole 108.

Further, the circuit board 100 has a ground plane 102 of large area that forms a reference potential plane for the internal circuit of the battery status detecting device 7, and a large sensing area 104 that has the same electrical potential as the pole 108. The temperature detecting element 80A is on the sensing area 104 and located apart from the ground plane 102. In addition, at least the communication control IC 72A is arranged on the ground plane (opposite side).

Thus, the battery status detecting device 7 in the vehicle apparatus of the embodiment adopts a configuration of the thermal coupling that couples the bus bar 110 being connected to the negative terminal of the battery 6 and the temperature detecting element 80A so as to remove a signal wiring connecting an external sensor (i.e., temperature sensor) and the circuit board. Therefore, the unwanted noise propagating through the wiring can be removed so that malfunction of the apparatus caused by the noise disappears and also decreasing reliability caused by the vibration-stress in the vehicle can be prevented.

Also, each of the bus bar 110 and the circuit board 100 is arranged on different planes (can be more than two planes). The temperature sensing element 80A mounted on the circuit board 100 is arranged at a plane that is confronted with the bus bar 110 so as to enhance the characteristics of the thermal coupling thereof. In addition, the bus bar 110 is connected to the negative terminal of the battery 6, and connecting to an internal terminal of the battery 6 with very low resistance, the thermal resistance can be lowered. Accordingly it makes possible to improve the detecting thermal characteristics between the internal portion of the battery 6 and the sensing element.

The bus bar also works as a shunt resistor 50 to detect the current of the battery 6. The temperature sensing element 80A is arranged close to the pole 108 that detects the voltage difference by the shunt resistor. The shunt resistor 50 has a good electrical conductivity, and necessarily has a good thermal conductivity. Hence, the characteristics of the thermal coupling between the bus bar 110 and the temperature sensing element can be enhanced by placing the temperature sensing element 80A close to the pole 108.

Further, the pole 106 in the two poles is connected to the ground terminal of the circuit board, and the temperature sensing element 80A is arranged close to the other pole 108. Since the sensing element is arranged close the pole 108 not the pole 106 where current to be consumed in the circuit board flows, it makes it possible to reduce the influence of the current being consumed. Hence, the characteristic of the thermal coupling is enhanced.

The circuit board 100 includes a large area of the ground plane as a reference potential plane. The temperature sensing element 80A is arranged at a point which is apart from the ground plane 102. The large area of the ground plane 102 makes it possible to reduce heat occurring at the circuit board caused by the current consumption of the circuit board 100 and arranging the sensing element apart from the ground plane to enhance the characteristic of the thermal coupling.

In addition, the circuit board 100 includes a large sensing area 104 having the same electrical potential with the pole 108 and the temperature sensing element 80A is arranged on the sensing area 104.

Thus, the temperature sensing element is arranged on the large sensing area 104 having the same electrical potential with the pole, and the characteristics of the thermal coupling can be enhanced.

The communication IC 72A is arranged on the ground plane 102. Therefore, thermal influence caused by the driving current of the communication circuit while the circuit is in operation can be reduced, and then the characteristic of the thermal coupling is enhanced. Further, noise from the communication circuit can be prevented in such a way.

What is claimed is:

1. An apparatus for controlling power generation of a generator mounted on a vehicle, the generator charging a battery mounted on the vehicle, comprising:
    a detecting device that detects information indicating an internal status of the battery, wherein the internal status of the battery includes temperature of the battery and the detecting device includes a detecting circuit that detects the temperature of the battery using a temperature sensing element, and a power supply circuit that supplies power to the detecting device;
    a calculator for calculating the internal status of the battery using the information detected by the detecting device;
    a circuit board having a first surface on which the calculator, the power supply circuit, and the detecting circuit are mounted, and a second surface on which the temperature sensing element is mounted;
    a controller that controls the power generation of the generator based on the internal status of the battery; and
    a bus bar electrically connected to a negative terminal of the battery, the bus bar including a first principal surface arranged in a plane along a longitudinal direction of the bus bar, a second principal surface positioned opposite to the first principal surface, and a plurality of side surfaces arranged in a thickness direction of the bus bar connecting the first principal surface with the second principal surface,
    wherein the second surface of the circuit board is arranged facing the first principal surface of the bus bar to make a thermal coupling between the temperature sensing element and the bus bar,
    the bus bar serves as a shunt resistor that detects the current flowing at the battery,
    a plurality of poles are arranged on one of the plurality of side surfaces of the bus bar such that the plurality of poles contact the one of the plurality of side surfaces and extend in a direction perpendicular to the longitudinal direction of the bus bar, the plurality of poles are electrically connected to the bus bar to detect a voltage difference between two poles among the plurality of poles at the shunt resistor, and the temperature sensing element is arranged closely to one of the plurality of poles.

2. The apparatus according to claim 1, wherein
the bus bar and the circuit board are arranged separately at different layers of at least two planes.

3. The apparatus according to claim 1, wherein
one of the two poles is electrically connected to the ground terminal of the circuit board, the temperature sensing element is arranged closely to an other of the two poles.

4. The apparatus according to claim 3, wherein
the circuit board has large area of the ground plane as a reference potential plane and the temperature sensing element is arranged at a point that is apart from the ground plane.

5. The apparatus according to claim 4, wherein
the circuit board has a large sensing area that has the same electrical potential as the other of the two poles and the temperature sensing element is arranged on the sensing area.

6. The apparatus according to claim 4, wherein
the detecting device equipped with a communication circuit to send out a battery status parameter based on the status of the battery and a control parameter of the generator that is calculated based on the status of the battery, the communication circuit being arranged on the ground plane.

7. A detecting device for detecting a status of a battery mounted on a vehicle, the detecting device comprising:
a resistor detecting a voltage across the resistor when current flows at least one of from or to the battery;
a bus bar having two poles and forming the resistor between the two poles, the bus bar being connected to a negative terminal of the battery, the bus bar including a first principal surface arranged in a plane along a longitudinal direction of the bus bar, a second principal surface positioned opposite to the first principal surface, and a plurality of side surfaces arranged in a thickness direction of the bus bar connecting the first principal surface with the second principal surface, a temperature sensing element thermally coupled to the battery to detect temperature of the battery;

a processing device processing signals from the resistor and the sensing element to detect the status of the battery; and a circuit board having a first surface on which the processing device is mounted, and a second surface opposite the first surface and facing the bus bar on which the temperature sensing element is mounted, wherein a plurality of poles are arranged on one of the plurality of side surfaces of the bus bar such that the plurality of poles contact the one of the plurality of side surfaces and extend in a direction perpendicular to the longitudinal direction of the bus bar, the plurality of poles are electrically connected to the bus bar to detect a voltage difference between two poles among the plurality of poles, and the temperature sensing element is arranged closely to one of the plurality of poles.

8. The device according to the claim 7, wherein one of the two poles is electrically connected to the ground terminal of the circuit board, the temperature sensing element is arranged closely to an other of the two poles.

9. The device according to claim 8, wherein
the circuit board has large area of the ground plane as a reference potential plane and the temperature sensing element is arranged at a point that is apart from the ground plane.

10. The device according to claim 9, wherein
the circuit board has a large sensing area that has the same electrical potential as the other of the two poles and the temperature sensing element is arranged on the sensing area.

11. The device according to claim 9, wherein
the device equipped with a communication circuit to send out a battery status parameter based on the status of the battery and a control parameter of an on-vehicle generator that is calculated based on the status of the battery, the communication circuit being arranged on the ground plane.

* * * * *